United States Patent

Lord

[15] 3,654,529

[45] Apr. 4, 1972

[54] LOOSE CONTACT PRESS PACK

[72] Inventor: Donald E. Lord, Skaneateles, N.Y.

[73] Assignee: General Electric Company

[22] Filed: Apr. 5, 1971

[21] Appl. No.: 131,403

Related U.S. Application Data

[63] Continuation of Ser. No. 796,137, Feb. 3, 1969, abandoned.

[52] U.S. Cl. ....................317/234 R, 317/234 E, 317/234 F, 317/234 M, 317/234 P, 317/235 AB

[51] Int. Cl. ..........................................H01l 3/00, H01l 5/00

[58] Field of Search ................317/234, 235 E, 235 F, 235 G, 317/235 H, 235 J, 235 M, 235 P, 235 AA, 235 AB

[56] References Cited

UNITED STATES PATENTS

| | | | |
|---|---|---|---|
| 3,261,075 | 7/1966 | Carman | 317/234 F |
| 3,396,316 | 8/1968 | Wislocky | 317/234 |
| 3,476,986 | 11/1969 | Tsuji | 317/234 |
| 3,457,472 | 7/1969 | Mulski | 317/234 |
| 3,458,776 | 7/1969 | Ferree | 317/234 |
| 3,492,545 | 1/1970 | Meyerhoff | 317/234 |

OTHER PUBLICATIONS

Spectrum IEEF Pressure Contact SCR, p. 109, by Gutzwiller, August 1967.

*Primary Examiner*—John W. Huckert
*Assistant Examiner*—Andrew J. James
*Attorney*—Robert J. Mooney, Carl O. Thomas, Frank L. Neuhauser, Oscar B. Waddell, Nathan J. Cornfeld and Joseph B. Forman

[57] ABSTRACT

A backup plate having a low thermal coefficient of expansion is loosely interposed between a terminal member of a device housing and a semiconductive element container therein. A thin protective layer is interposed between the backup plate and semiconductive element and overlies a surface of the element adjacent a diffused junction. A resilient annular junction passivant ring centers the semiconductive element within the housing, protects the semiconductive element against laterally transmitted mechanical shocks, and locates the backup plate.

3 Claims, 5 Drawing Figures

INVENTOR:
DONALD E. LORD,

BY Carl O. Thomas

HIS ATTORNEY.

LOOSE CONTACT PRESS PACK

This application is a continuation of my application Ser. No. 796,137, filed Feb. 3, 1969, titled Loose Contact Press Pack and now abandoned.

My invention relates to a semiconductor device exhibiting a low level of internal contact impedance and a high degree of protection against junction contamination and thermally and mechanically induced stresses.

Typically a semiconductor device is formed by mounting a semiconductor element containing at least one PN junction in a hermetically sealed housing. Typically the conductive portions of the housing which serve as the terminals for the device are formed of a metal, such as aluminum, copper, brass, etc., which exhibits a relatively high coefficient of thermal expansion as compared to the semiconductive element. Rather than to attempt a direct interconnection between the housing terminals and the semiconductive element, it is conventional practice to interpose a backup plate comprised of a metal having a relatively low thermal coefficient of expansion, usually tungsten or molybdenum, to protect the semiconductive element from stresses transmitted from the housing terminals during thermal cycling.

In constructing semiconductor devices with low expansion backup plates interposed between the housing terminal portions and the semiconductive element, the necessity of soldering the backup plates to both the housing portions and the semiconductive element surfaces has been partially avoided by utilizing a housing construction in which the housing terminal portions are compressed against the backup plates which in turn press against the semiconductive element surfaces. Devices having housings relying upon compression of elements are typically referred to as press packs. Compression housings have not eliminated the necessity of soldering the contact surfaces between elements entirely, however, since it has been found that high contact impedance results when backup plates are compressed against certain elements without soldering. For example, it has been found that an adequate electrical contact can be formed by merely compressing a backup plate against a gold layer on a semiconductive element surface where the gold layer is put down for the purpose of forming a junction by alloying. At the same time a high impedance electrical contact has been observed to result when a backup plate is compressed directly against the surface of a semiconductive element adjacent a junction formed by diffusion. To provide a specific illustration of conventional practices, in silicon controlled rectifiers having a diffusion formed anode emitter junction and an alloy formed cathode emitter junction, it is conventional practice to solder the backup plate to the anode surface of the semiconductive element while the backup plate associated with the cathode surface is typically merely pressed against the alloyed gold layer on the upper surface of the semiconductive element and soldered to the housing terminal. With silicon controlled rectifier semiconductive elements having all the junctions formed by diffusion, it has been necessary to solder the backup plate directly to both anode and cathode surfaces in order to avoid high contact impedances.

It is an object of my invention to provide a semiconductor device having one or more backup plates in which the necessity of soldering or otherwise attaching the backup plates to a surface of a semiconductive element adjacent a diffused junction in order to avoid high internal contact impedances is eliminated.

It is another object of my invention to provide a semiconductor device in which the semiconductive element and/or backup plates may be efficiently positioned within the housing without attachment thereto.

These and other objects of my invention are achieved in one aspect by providing a semiconductor device comprised of a junction containing semiconductive element having first and second opposed major surfaces separated by the junction. First and second contact means are associated with the first and second surfaces, respectively. Housing means encapsulate the semiconductive element and the contact means and are comprised of an insulative portion and first and second electrically conductive portions sealingly associated with the insulative portion and are adapted to be compressively associated with the first and second contact means, respectively, in electrically conductive relation therewith. Resilient dielectric means are peripherally associated with the junction and cooperate with the housing means to hold the semiconductive element in alignment with the electrically conductive portions.

In another aspect my invention is directed to a semiconductor device comprised of an entirely diffused junction containing silicon semiconductive element having first and second opposed major surfaces separated by the junction. First and second contact means are associated with the first and second surfaces, respectively. Housing means encapsulate the semiconductive element and the contact means and are comprised of an annular insulative portion and first and second electrically conductive portions sealingly associated with the insulative portion and are adapted to be compressively associated with the first and second contact means, respectively, in electrically conductive relation therewith. Dielectric passivant means are peripherally associated with the junction. At least one of the first and second contact means is comprised of a thin protective layer adhered to one of the surfaces of the semiconductive element and a backup plate interposed between the protective layer and one of the conductive portions, the backup plate being formed of an electrically conductive metal having a thermal coefficient of expansion less than said associated contact portion relying entirely upon compressive association to establish a low impedance engagement with the thin protective layer.

My invention may be better understood by reference to the following detailed description considered in conjunction with the drawings, in which FIG. 1 is a vertical section through a preferred embodiment of my invention;

Figure 1:
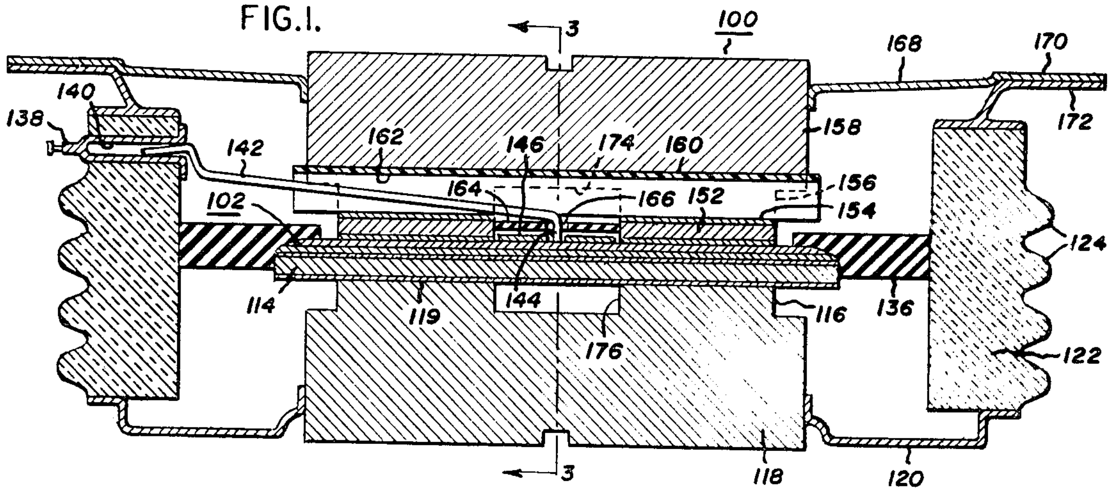
Figure 2:
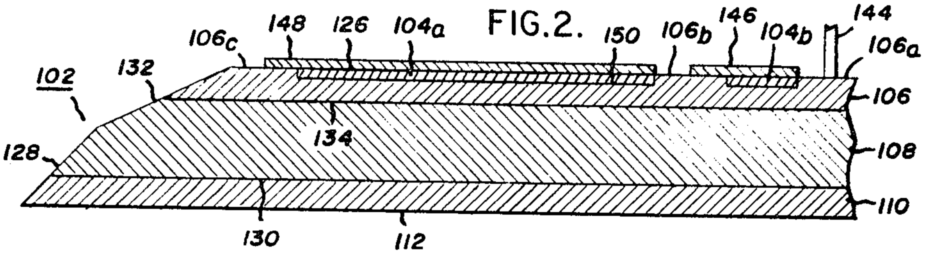
FIG. 2 is an enlarged vertical section through the semiconductive element.

In FIG. 1 a semiconductor device 100 is shown in vertical section having a semiconductive element 102 mounted therein, shown separately in FIG. 2. In the form shown the semiconductive element is comprised of a first layer divided into a main portion **104*a* and a pilot portion 104*b*. A second layer 106 of opposite conductivity type includes a gate portion 106*a* which is located centrally of the pilot portion of the first layer. The gate portion is separated from the main portion of the first layer by the pilot portion of the first layer. The second layer is additionally provided with a spacing portion 106*b* which separates the pilot and main portions of the first layer. Finally, the second layer includes a remote portion 106*c* which is separated from the pilot portion of the first layer by the main portion thereof. A third layer 108 is separated from the first layer by the second layer and is of like conductivity type as said first layer and of opposite conductivity type from said second layer. A fourth layer 110** is of like conductivity type as the second layer and of opposite conductivity type from the first and third layers. It is then apparent that the semiconductive element is comprised of two P type conductivity layers and two N type conductivity layers interleaved to form a thyristor or controlled rectifier element.

As shown a first major surface 112 of the semiconductive element adjacent fourth layer 110 is positioned adjacent a backup plate 114 having a relatively low thermal coefficient of expansion as compared to the adjacent pedestal portion 116 of the housing terminal member 118. Typically the housing terminal member is formed of a metal, such as brass, copper, aluminum, etc., having a high degree of electrical and thermal conductivity, but exhibiting a thermal coefficient of expansion very much higher than the thermal coefficient of expansion of the semiconductive element metal, typically silicon. Since the semiconductor device may be called upon to withstand thermal excursions as high as from −60° to 200° C. either in use or storage, it is undesirable to place the terminal member in direct contact with the semiconductive element. This would result in large thermally induced stresses being transmitted to the semiconductive element. To reduce thermally induced stresses the backup plate 114 is formed of an electrically conductive metal having a thermal coefficient of expansion below that of the housing terminal member. It is preferred to utilize a metal, such as tungsten, molybdenum, or tantalum, which exhibits a thermal coefficient of expansion of less than $1 \times 10^{-5}$ in/in per °C., most preferably less than $0.5 \times 10^{-5}$ in/in per °C. A thin layer 119 of a malleable metal, such as gold or silver, is shown interposed between the backup plate 114 and the terminal member 118.

The terminal member 118 is welded or otherwise sealingly secured to an annular flange 120. The flange is in turn sealingly secured to an annular electrically insulative ring 122. The ring is preferably formed of a material having a high dielectric strength, such as glass or ceramic materials. The exterior surface of the ring is provided with four (as shown) annular protrusions 124 to increase the exterior surface distance between the opposite extremities of the ring.

The semiconductive element is provided with a second major surface 126 formed by the first and second layers. The second major surface is parallel to the first major surface. To reduce the likelihood of surface breakdown of the semiconductive element under forward or reverse blocking conditions, the parallel major surfaces are joined by a first beveled peripheral surface 128 which intersects the anode emitter junction 130 between the third and fourth layers at an acute angle. A second beveled peripheral surface 132 intersects the cathode base junction 134 formed between the second and third layers at an acute angle. As is well understood by those skilled in the art the acute angles at which the first and second beveled peripheral surfaces intersect the adjacent junctions may be chosen to modify the electrical field gradient along the surfaces to increase the reverse and forward blocking voltages that may be withstood by the device without damage.

An annular member 136 extends between the interior surface of the ring member and the peripheral surfaces of the semiconductive element and the backup plate 114. It is an inventive feature of the semiconductor device construction that the annular member efficiently performs several diverse functions. The annular member cooperates with the interior surface of the ring to hold the semiconductive element and backup plate 114 in centered relation with the pedestal portion 116 of the housing terminal member 118. Since the annular member 136 is preferably formed of a resilient material, it is unnecessary to provide a clearance between the ring and annular member to allow for fitting or for differentials in thermal expansion. Further, the resiliency of the annular member allows very wide tolerances to be maintained in forming the interior surface of the ring, thereby allowing its cost to be reduced. The resiliency of the annular member also protects the semiconductive member from laterally transmitted mechanical shocks that might otherwise fracture the semiconductive element. The annular member is formed of a junction passivant material having a relatively high insulative resistance and dielectric strength and is substantially impervious to junction contaminants. I prefer to utilize passivants having a dielectric strength of at least 100 volts/mil and an insulative resistance of at least $10^{10}$ ohm-cm. A number of commercially available forms of silicone rubber are noted to meet these electrical criteria. In the form shown the annular member is formed by molding silicone rubber to the periphery of semiconductive element and back up plate 114.

In the form shown the ring is provided with a gate terminal member 138 sealingly fitted therein. The gate terminal member is provided with a closed end recess 140 that receives a resilient gate lead spring 142. The lower end 144 of the gate lead spring is resiliently urged against the gate portion 106*a* of the second layer of the semiconductive element.

A pilot ring 146 is spaced laterally from the lower end of the gate lead spring with its inner edge substantially coextensive with the pilot portion of the first layer and its outer edge overlying the spacing portion of the second layer, but spaced from the main portion of the first layer. The pilot ring may be formed of any electrically conductive material, such as any conventional contact metal layer or combination of metal layers.

A thin protective layer 148 overlies the main portion of the first layer with its outer edge also extending over the remote portion of the second layer. The function of the protective layer is to minimize any resistance or voltage drop over the first and second layer portions which it overlies. Semiconductive elements formed of silicon, for example, are known to form thin oxide coatings when exposed to the atmosphere. Where the cathode emitter junction 150 between the main portion of the first layer and the second layer is formed by diffusion, silicon is exposed over the upper surface of the first layer. I adhere the thin protective layer before the surface has had an opportunity to build up the normal oxide coating. The protective layer may be formed of any of a wide variety of metals known to be capable of forming adherent layers to semiconductive elements, such as aluminum, gold, silver, vanadium, platinum, nickel, tungsten, molybdenum, tantalum, and multilayer combinations. By maintaining the protective layer thin, in the order of from 100 A. to 1 mil in thickness, the amount of thermal stress that may be transmitted to the semiconductive element by the protective layer remains negligibly small.

Annular backup plate 152 coextensively overlies the protective layer. The annular backup plate is chosen by applying the same electrical conduction and thermal expansion considerations discussed with reference to backup plate 114 and is usually conveniently formed of the same metal as back up plate 114. Since tungsten and molybdenum, the two most common backup plate metals, are quite rigid, it is preferred to utilize a relatively malleable metal to form the protective layer. In such circumstance the protective layer improves the electrical conduction between the backup plate and semiconductive element by reducing oxidation and also by deforming on compression to conform more closely to the adjacent surface of the backup plate.

I prefer to utilize aluminum to form the protective layer, since it is a highly electrically conductive, malleable, and low cost metal. Aluminum is widely used to solder backup plates to silicon semiconductive elements. In such circumstance the aluminum adheres to the silicon by becoming at least partially alloyed therewith. I have found, however, that when it is desired to merely compress a backup plate against aluminum without bonding to the aluminum a high contact impedance results. I have observed this to be the result of surface asperities forming on the aluminum as the result of alloying. This is believed to be attributable to the fact that aluminum does not readily wet silicon prior to alloying. Accordingly, when it is attempted to melt an aluminum preform or solder laid on a silicon bonding surface, dispersed alloying sites occur on the surface and the aluminum is drawn toward the alloying sites, since aluminum readily wets the silicon-aluminum alloy. I have found that when a thin protective layer of aluminum is laid down without alloying the aluminum to the silicon so that the aluminum remains essentially silicon free, a surface is formed on the protective layer that is free of asperities and which permits a low impedance contact to be achieved to a compressively associated backup plate without other means of bonding. Where the aluminum is deposited in a highly energetic form—as by vapor deposition, electron beam deposition, etc.,—it is believed that the aluminum robs the silicon of whatever combined oxygen is present at the surface, thereby further enhancing the low contact impedance characteristics. It is recognized that in most applications it will be desirable to form the pilot ring 146 simultaneously with and in the same manner as the protective layer 148 is formed, although this is not essential.

Figure 3:
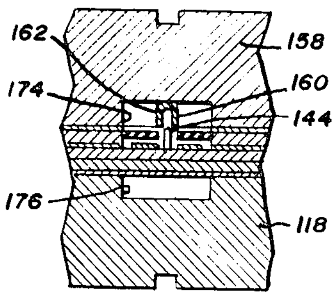
FIG. 3 is a sectional detail taken along section line 3—3 in FIG. 1.
Figure 4:
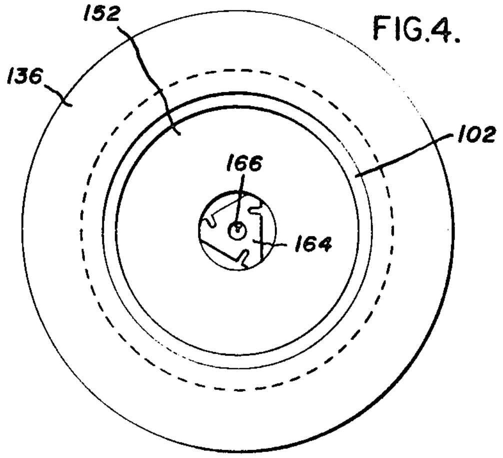
FIG. 4 is a plan view of a sub-combination.

The annular backup plate is provided with a thin malleable layer 154 adjacent its upper surface that cooperates with the pedestal portion 156 of the housing terminal member 158. The malleable layer 154 is formed similarly as and performs like function as the malleable layer 119. The housing terminal members 118 and 158 may be identically formed, except that the housing terminal member 158 is provided with a central slot 160 within which an insulative lining 162 is located, as is best shown in FIG. 3. The slot allows the gate lead spring access to the central upper surface of the semiconductive element while the lining prevents shorting of the gate lead spring to the housing terminal member 158. The slot also prevents the gate lead spring from twisting laterally. An electrically insulative centralizer 164 cooperates with the inner periphery of the annular backup plate to hold it in alignment. The centralizer contains a central aperture 166 which receives the end 144 of the gate lead spring. Thus, the gate lead spring indexes the annular backup plate. The housing terminal means 158 is sealingly united to flange 168 which is in turn provided with a peripheral rim 170. A cooperating rimmed flange 172 is sealingly joined to the insulative ring.

In assembling the semiconductor device, the terminal member 118, flange 120, ring 122, gate terminal 138, and rimmed flange 172 are initially united to form a lower housing portion. The backup plate 114 with its thin malleable layer 119 attached and the semiconductive element 102 with its protective layer 148 and pilot ring 146 attached are joined to the molded annular member 136. The resulting sub-assembly is then introduced into the lower housing portion and set on the pedestal portion 116 of the lower housing terminal member. The centralizer 164 is then fitted to the inner edge of the annular backup plate 152 which is then placed over the protective layer. The gate lead spring 142 is inserted into the recess 140 of the gate terminal and rotated with its lower end 144 being forcibly deflected upwardly so that it enters the aperture 166 in the centralizer. The terminal member 158 is attached to the flange 168 to form the upper housing portion. The upper housing portion with the lining 162 in the slot 160 of the terminal member is then positioned so that the pedestal portion 156 overlies the annular backup plate. The slot 160 is aligned to receive the gate lead spring.

The flange 168 is located so that the rim portion 170 preferably engages the rimmed flange 172 before the pedestal portion 156 of the terminal member 158 engages the malleable layer 154 on the upper surface of the backup plate. The clearance between these elements, is, however, maintained quite small, usually less than 5 mils. This allows the rim portion 170 and rimmed flange 172 to be cold welded into sealing relationship while transmitting a minimum of stress to the device.

When the semiconductor device is placed into use, compressive forces are applied to the upper and lower terminal members 118 and 158 so that the annular flanges 120 and/or 168 deform sufficiently to bring the pedestal portion 156 of terminal member 158 into direct compressive contact with the malleable layer 154. Thus, it can be seen that a compressed stack is formed in which terminal member 118 compressively bears against malleable layer 119 of backup plate 114 which is secured to or bears against the surface 112 of semiconductive element 102. At the same time protective layer 148 bears against the upper surface of the semiconductive element, being urged thereagainst by annular backup plate 152 which is in turn compressively urged inwardly by pedestal portion 156 of terminal member 158. Structures for compressing the terminal members inwardly and making thermal and electrical contact thereto are well known in the art and form no part of my invention. The upper pedestal portion is recessed at 174 to avoid the possibility of contact with the pilot ring while the lower pedestal portion is recessed at 176 over an identical area. Aligning the upper and lower pedestals forestalls any possibility of a bending moment being transmitted to the semiconductive element 102 which could result in undue stress or fracture of this element.

It is not necessary to solder or otherwise bond the annular backup plate to either the protective layer or the adjacent pedestal in order to achieve a low impedance contact between the terminal member and the semiconductive element. This is surprising, since it has been heretofore considered necessary to bond a backup plate directly to the surface of a semiconductive element adjacent a diffused junction. It is a novel feature of the semiconductor device that the backup plate is assembled into the device "loose", that is, free of direct bonding to either the protective layer or the associated pedestal portion. With only a compressive association with the protective layer and the pedestal portion a low impedance interconnection is achieved through the backup plate between the terminal member and the semiconductive element. This arrangement is advantageous for a variety of reasons. For example, the step of soldering the backup plate to the semiconductive element and/or pedestal portion is eliminated with a corresponding savings in both time and materials. The possibility of damaging the semiconductive element by excessive stresses produced during soldering and the possibility of device failure by fatigue of the solder joint during thermal cycling are eliminated. Also, the use of a "loose" backup plate allows the thickness of this plate to be reduced below that required in comparable devices having the backup plate soldered to at least one surface.

The backup plate 114 may be associated with the first major surface 112 of the semiconductive element similarly as the annular backup plate is associated with the second major surface 126. For example, the backup plate 114 may be loosely mounted in that it may not be directly bonded to either the pedestal portion 116 or the semiconductive element. To minimize contact impedance it is preferred to interpose a protective layer similar to protective layer 148 between the semiconductive element and the backup plate 114. It may be convenient to form the protective layers on opposite major surfaces of the semiconductive element as well as the pilot ring 146 identically in a single or successive plating operations. It is, of course, recognized that advantage may be obtained from the invention if either of backup plates 114 and 152 are loosely mounted according to the invention. For example, the backup plate 114 may be bonded to the first major surface of the semiconductive element by hard or soft soldering without diminishing the advantage to be achieved by loosely mounting the annular backup plate 152 as described.

The semiconductor device 100 is a gate controlled rectifier or thyristor having a pilot turn on feature that allows the device to withstand high di/dt and dv/dt operation modes. A description of the electrical operating characteristics of such a semiconductor device are set out by Moyson in application Ser. No. 741,675, filed July 1, 1968, titled Monolithic Compound Thyristor, the disclosure of which is here incorporated by reference. A detailed description of the general electric switching characteristics of the device is therefore considered unnecessary in this application. It is to be noted, however, that when the device is in its conducting mode a low impedance high current path is provided between the terminal members. Current in flowing from the anode terminal member 118 to the cathode terminal member 158 first flows from the pedestal portion 116 to the backup plate 114. The thin malleable layer 119, typically a gold or silver layer, is deformed by compression so that it provides intimate electrical interconnection between the pedestal portion and the backup plate, despite any slight irregularities that may be present. Current flowing from the backup plate 114 to the semiconductive element and from the semiconductive element to the backup plate 152 is achieved with a minimal forward voltage drop by reason of providing the thin protective layer adhered to either or both major surfaces to minimize surface impedances, such as may be produced by oxidation, for example. The thin protective layer allows the backup plates to be merely compressed against rather than soldered to the semiconductive element even though the junctions adjacent the surfaces of the semiconductive element are formed by diffusion. The current path from the backup plate 152 through the malleable layer 154 to the pedestal portion 156 of the terminal member 158 also provides a low contact impedance. The result is that the semiconductive device exhibits a lower forward voltage drop when present in an electrical circuit in the conducting mode. This not only improves the efficiency of the device, but also increases the power handling capabilities, since the internal resistance of the device is maintained at a relatively low level.

Figure 5:
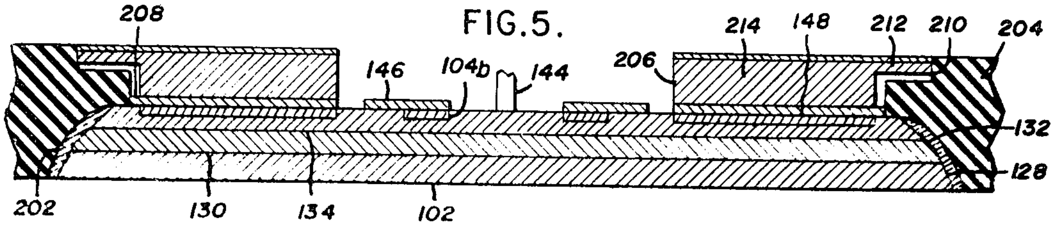
FIG. 5 is a vertical section with parts broken away of a modified sub-combination according to my invention.

In FIG. 5 an alternate form of my invention is disclosed. A glass passivation layer 202 is adhered to the beveled surfaces 128 and 132 that intersect junctions 130 and 134, respectively. The glass layer provides a high degree of protection from contamination to the semiconductive element junctions and additionally increases peak blocking voltages that can be withstood by the semiconductive element upon reverse biasing of the semiconductor device. The glass exhibits a thermal expansion differential with respect to the semiconductive element of less than $5 \times 10^{-4}$. That is, if a unit length is measured along the surface of a semiconductive element with a layer of glass attached at or near the setting temperature of the glass and the semiconductive element and glass are thereafter reduced in temperature to the minimum ambient temperature to be encountered in use by a semiconductor device in which the semiconductive element is to be incorporated, the observed difference in the length of the glass layer as compared to the semiconductive element over the unit length originally measured at any temperature between and including the two extremes should be no more than $5 \times 10^{-4}$. It is appreciated that the thermal expansion differential so expressed is a dimensionless ratio of difference in length per unit length. By maintaining the thermal expansion differential below $5 \times 10^{-4}$ (preferably below $1 \times 10^{-4}$), the thermal stresses transmitted to the glass by the semiconductive element are held to a minimum, thereby reducing the possibility of cleavage, fracture, or spalling of the glass due to immediately induced stresses or due to fatigue produced by thermal cycling.

Since the glass layer should bridge at least one junction of the semiconductive element, it is important that the glass exhibit an insulative resistance of at least $10^{10}$ ohm-cm, so as to avoid shunting any significant leakage current around the junction to be passivated. To withstand the high field strengths likely to be developed across the junction during reverse bias, as is particularly characteristic of rectifiers, the glass layer is chosen to exhibit a dielectric strength of at least 100 volts/mil and preferably at least 500 volts/mil for high voltage rectifier uses. When the semiconductive element is properly peripherally beveled and provided with a glass passivation layer the semiconductive element is capable of withstanding reverse biasing at exceptionally high potential levels without being destroyed.

Two exemplary glasses that meet the preferred thermal expansion differential, dielectric strength, and insulative resistance characteristics discussed above and which are considered particularly suitable for use with silicon semiconductive elements are set out in Table I, percentages being indicated on a weight basis.

TABLE I

| Composition | No. 45 | No. 351 |
|---|---|---|
| $SiO_2$ | 12.35% | 9.4% |
| ZnO | 65.03 | 60.0 |
| $Al_2O_3$ | 0.06 | — |
| $B_2O_3$ | 22.72 | 25.0 |
| $CeO_2$ | — | 3.0 |
| $Bi_2O_3$ | — | 0.1 |
| PbO | — | 2.0 |
| $Sb_2O_3$ | — | 0.5 |

Glass is commercially available under the trade name "GE Glass 351" and Glass 45 is available under the trade name "-Pyroceram 45". Other zinc-silico-borate glasses are available that meet the required physical characteristics. For example, the zinc-silico-borate glasses disclosed by Martin in U. S. Pat. No. 3,113,878, may be employed.

The resilient annular member 204 is molded over the glass layer 202. The resilient annular member 204 serves the same general functions as the resilient annular member 136 and cooperates similarly with the housing of the device. Since the glass layer serves as the primary protection to the junctions, it is not necessary that the annular member be formed of a junction passivant material, however, although it is preferred to form the annular member 204 to meet the same electrical characteristics noted with respect to the annular member 136. This allows the member 204 to supplement the glass layer in passivating the junction. For example, the chances of a contaminant reaching the junctions through a crack or other irregularity in the glass layer is minimized by having the annular member 204 formed of a passivant material such as silicone rubber.

In addition to performing the functions of the annular member 136, the annular member also functions to centralize the backup plate 206 with respect to the protective layer 148, thus eliminating the need for centralizer 164. Since a small amount of flash 208 is typically formed where the mold housing for the annular member 204 fits against the protective layer, I space the backup plate inwardly from the annular member. This guards against any portion of the flash becoming interposed between the backup plate and protective layer to produce a high impedance interconnection. While it is very difficult to prevent some small amount of flash from occurring at the intersection of the mold with the semiconductive element in forming the annular member, an outwardly stepped shoulder 210 can be easily and accurately formed in the annular member. The backup plate is then provided with an exterior lip portion 212 that cooperates with the stepped shoulder to hold the main portion 214 of the backup plate spaced from the flash and centralized.

While my invention has been disclosed with specific reference to a gate controlled rectifier or thyristor, it is apparent that it is capable of substantially broader application. For example, instead of using a gate turn on thyristor element having an integrated monolithic pilot as shown, the pilot turn on feature could be eliminated merely by eliminating pilot portion **104*b* of the first layer and the pilot ring 146. Without a pilot turn on feature the annular backup plate could be extended inwardly much closer to the gate contact so as to increase the cathode area. With a small spacing an insulative sleeve on the gate lead spring could be substituted for centralizer 164. It is, of course, recognized that any conventional gate operated thyristor element could be substituted for semiconductive element 102. With thyristor elements having edge or uncentered gate contacts the gate lead spring 142 could be substituted by a conventional gate contact lead. Also, instead of using the gate lead as a gate lead for a thyristor, the gate lead could be used as a base lead for a transistor if such an element were substituted for the thyristor element. Instead of using an insulative slot liner the gate lead spring may be provided with an insulative coating mediate its ends. The invention is also generally applicable to rectifiers lacking gates. In such instance the gate terminal 138, gate lead spring 142, slot 160, and liner 162** could be omitted.

It is appreciated that the glass layer 202 could be interposed between the annular member 136 and semiconductive element in the embodiment of FIG. 1, if desired. Similarly, the glass layer 202 could, if desired, be omitted from the arrangement shown in FIG. 5. The annular member 204 in FIG. 5 need not be provided with a stepped shoulder 210 in order to center the backup plate 206.

While the invention has been disclosed with reference to a preferred low cost, efficient housing construction, it is appreciated that the invention could be easily applied to conventional housing configurations. For example, my invention could be easily applied to housing configurations as disclosed by Marino et al. U.S. Pat. No. 3,252,060, Steinmetz et al. U.S. Pat. No. 3,296,506, or Ferree U.S. Pat. No. 3,337,781. It is, of course, appreciated that since the resilient annular member and glass passivant act to protect the junctions of the semiconductive element from contamination, having a hermetically sealed housing is not essential. The resilient annular member could, if desired, index the semiconductive element and/or backup plate(s) by engaging the terminal member 118 instead of ring 122.

Since it is considered that these and numerous other variations of my invention would readily occur to those skilled in the art having considered my disclosure, it is intended that the scope of my invention be determined by reference to the following claims.

What I claim as new and desire to secure by Letters Patent of the United States is:

1. A semiconductor device comprised of
an entirely diffused junction containing silicon semiconductive element having first and second opposed major surfaces separated by said junction,
first and second contact means associated with said first and second surfaces, respectively,
housing means encapsulating said semiconductive element ans said contact means comprised of
an annular insulative portion and
first and second electrically conductive portions sealingly associated with said first and second contact means, respectively, in electrically conductive relation therewith,
dielectric passivant means peripherally associated with said junction, and
at least one of said first and second contact means being comprised of
a thin protective layer of essentially silicon-free aluminum ranging in thickness from 100 A. to 1 mil adhered to one of said surfaces of said semiconductive element and a loose backup plate compressively interposed between said protective layer and one of said conductive portions formed of an electrically conductive metal having a thermal coefficient of expansion of less than 1 33 $10^{-5}$ in/in per °C.

2. A thyristor comprising
a silicon semiconductive element having first, second, third, and fourth interleaves diffused P and N type layers forming PN junctions therebetween, said fourth layer lying adjacent a first major surface of said element and said first and second layers lying adjacent an opposed second major surface of said element, said first layer being comprised of a main portion and a pilot portion, said second layer including a gate portion separated from said main portion of said first layer by said pilot portion, a spacing portion interposed between said main and pilot portions of said first layer, and a remote portion separated from said pilot portion by said main portion of said first layer,
first contact means associated with said main portion of said first layer and said remote portion of said second layer,
second contact means associated with said fourth layer,
conductive means associated with said pilot portion of said first layer and said spacing portion of said second layer,
housing means hermetically encapsulating said semiconductive element and said contact means comprised of
an annular insulative portion and
first and second electrically conductive portions sealingly associated with said insulative portion and compressively associated with said first and second contact means, respectively, in electrically conductive relation therewith,
resilient dielectric junction passivant means peripherally associated with said semiconductive element and cooperating with said housing means to hold said semiconductive element in alignment with said electrically conductive portions
at least one of said first and second contact means being comprised of
a thin protective layer consisting essentially of aluminum adhered without alloying to at least said first major surface of said semiconductive element and
a loose backup plate compressed between said protective layer and one of said conductive portions, said back up plate exhibiting a thermal coefficient of expansion of less than $1 \times 10^{-5}$ in/in per °C.,
gate lead means extending from said gate portion of said second layer of said semiconductive element to the exterior of said housing means, and
insulative means associated with said gate lead means overlying said spacing portion of said second layer to position said loose backup plate in alignment with said thin protective layer.

3. A semiconductor device comprising
an entirely diffused junction containing silicon semiconductive element having first and second opposed major surfaces separated by said junction, said first major surface being formed of N type conductivity silicon,
first and second contact means associated with said first and second surfaces, respectively,
housing means encapsulating said semiconductive element and said contact means comprised of
an annular insulative portion and
first and second electrically conductive portions sealingly associated with said insulative portion and adapted to be compressively associated with said first and second contact means, respectively in electrically conductive relation therewith,
dielectric passivant means peripherally associated with said junction, and
at least said first contact means being comprised of
a thin protective layer consisting essentially of aluminum adhered without alloying to at least said first major surface of said semiconductive element and a loose backup plate compressively interposed between said protective layer and one of said conductive portions formed of an electrically conductive metal having a thermal coefficient of expansion of less than $1 \times 10^{-5}$ in/in per °C.

* * * * *

PO-1050
(5/69)

UNITED STATES PATENT OFFICE
CERTIFICATE OF CORRECTION

Patent No. 3,654,529 Dated April 4, 1972

Inventor(s) Donald E. Lord

It is certified that error appears in the above-identified patent and that said Letters Patent are hereby corrected as shown below:

In the claims, Claim 1, Column 9, line 42, change "1 33 $10^{-5}$in/in per°C" to read -- 1 X $10^{-5}$in/in per°C --.

Signed and sealed this 21st day of November 1972.

(SEAL)
Attest:

EDWARD M.FLETCHER,JR.
Attesting Officer

ROBERT GOTTSCHALK
Commissioner of Patents